(12) United States Patent
Bo

(10) Patent No.: US 6,807,730 B2
(45) Date of Patent: Oct. 26, 2004

(54) PAD STRUCTURE OF SEMICONDUCTOR PACKAGE

(75) Inventor: Won-Dong Hwang Bo, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/389,973

(22) Filed: Mar. 18, 2003

(65) Prior Publication Data

US 2003/0132026 A1 Jul. 17, 2003

Related U.S. Application Data

(62) Division of application No. 09/458,037, filed on Dec. 10, 1999, now Pat. No. 6,570,100.

(30) Foreign Application Priority Data

Jul. 20, 1999 (KR) ........................................ 1999-29391

(51) Int. Cl.[7] ................................................ H05K 3/34
(52) U.S. Cl. ............................ 29/840; 29/832; 29/852; 228/179.1; 228/180.21
(58) Field of Search .......................... 29/825, 832, 840, 29/852, 842, 843; 228/179.1, 180.1, 180.21, 179; 174/260

(56) References Cited

U.S. PATENT DOCUMENTS

| | | | | |
|---|---|---|---|---|
| 5,283,947 A | * | 2/1994 | Santo et al. | 29/840 |
| 5,498,575 A | * | 3/1996 | Onishi et al. | 228/180.21 |
| 5,541,367 A | * | 7/1996 | Swamy | 174/260 |
| 5,593,080 A | * | 1/1997 | Teshima et al. | 228/39 |
| 5,647,124 A | * | 7/1997 | Chan et al. | 29/840 |
| 5,743,007 A | * | 4/1998 | Onishi et al. | 29/840 |
| 5,815,919 A | * | 10/1998 | Nakanishi et al. | 29/840 |
| 5,874,043 A | * | 2/1999 | Sarkhel et al. | 420/557 |
| 6,010,060 A | * | 1/2000 | Sarkhel et al. | 228/179.1 |
| 6,545,229 B1 | * | 4/2003 | Ma et al. | 174/263 |

* cited by examiner

Primary Examiner—Carl J. Arbes
(74) Attorney, Agent, or Firm—Robert E. Bushnell, Esq.

(57) ABSTRACT

A pad structure for a semiconductor package is provided by forming solder lands at predetermined locations on a printed circuit board. First circular pad portions are formed protruding laterally from upper surfaces of the solder lands. Second circular pad portions are formed protruding laterally from other lateral sides of the pads. The leads are secured to the pads of the semiconductor package so that, when the first and second circular pad portions are pushed laterally, the circular pad portions do not contact each other, thereby preventing short circuits.

13 Claims, 9 Drawing Sheets

PAD STRUCTURE OF SEMICONDUCTOR PACKAGE

CROSS-REFERENCE TO RELATED APPLICATIONS

This application is a divisional application of U.S. patent application Ser. No. 09/458,037 filed on Dec. 10, 1999 U.S. Pat. No. 6,570,100. This related application is relied on and incorporated herein by references in its entirety.

CLAIM OF PRIORITY

This application makes reference to, incorporates the same herein, and claims all benefits accruing under 35 U.S.C. §119 from my application PAD STRUCTURE OF SEMICONDUCTOR PACKAGE filed with the Korean Industrial Property Office on Jul. 20, 1999 and there duly assigned Serial No. 29391/1999.

BACKGROUND OF THE INVENTION

1. Field of the Invention

The present invention relates to semiconductor packages, specifically to semiconductor packages with pad structures formed on Printed Circuit Boards (PCBs) improved to prevent short circuits.

2. Description of the Prior Art

Generally, a semiconductor package comprises a semiconductor body and a plurality of leads extending from the semiconductor. Such semiconductor packages are secured to a PCB by such methods as soldering.

Recently, as the number of leads extending from the semiconductor has increased due to a high degree of integration, the spacing between the leads has tended to become shorter. As the spacing between the leads decreases, short circuits caused by contacts between the leads occur more frequently. Therefore, it is necessary to secure a plurality of leads with small spacing onto the PCB effectively.

A typical semiconductor package comprises a semiconductor body and a plurality of leads extending from both sides of the semiconductor body. On the PCB at locations corresponding to the leads, a plurality of pads are formed. At the middle portion of the pad, a squared pad portion is formed. When securing the package onto the PCB, the leads are soldered to the engaging portions and the squared pad portions.

However, when the lead is attached to the pad, the squared portions of the pad protrude laterally, forming a contact portion abutting with the squared portion of the adjacent pad. This causes short circuits which deteriorate the performance of the semiconductor.

Generally, flatness of the pad is maintained within 80 to 100 $\mu$m. The lead is attached to the pad uniformly when such flatness is maintained. However, when the end portions of the connectors and leads of a quad flat pack (QFP) are raised upward to a predetermined height rendering the flatness in excess of 150 $\mu$m, the lead may float or the leads may not be attached to the pad properly. This may also cause inadequate tensile strength.

Furthermore, since the squared pad portion is formed at the middle portion of the pad, the lead tends to be fused only to both lateral sides of the middle portions of the lead. Therefore, when the lead is not maintained horizontal to a predetermined degree, the forward or rear portion tends to float with only the middle portion being attached, reducing the tensile strength.

SUMMARY OF THE INVENTION

It is therefore an object of the present invention to provide an improved pad structure for a semiconductor package.

It is a further object of the invention to provide a pad structure which is resistant to the formation of short circuits between the leads during soldering.

It is a yet further object of the invention to provide a pad structure which has an increased tensile strength.

It is a still further object of the invention to provide a pad structure which prevents floating of the leads even if the leads are perfectly flat.

The above and other objects, advantages and features of the present invention will become more readily appreciated and understood from a consideration of the following detailed description of a preferred embodiment of this invention when taken together with the accompanying drawings.

In order to achieve the above objects, a pad structure for a semiconductor package according to the present invention comprises: a printed circuit board with solder lands formed on predetermined portions thereof; and a plurality of pads formed on upper surfaces of the solder lands to which a plurality of leads of the semiconductor package is attached, first circular pad portions protruding laterally from lateral sides of the pads, second circular pad portions protruding laterally from other lateral sides of the pads, wherein the leads are secured to the pads of the semiconductor package so that when the first and second circular pad portions are pushed laterally, the circular pad portions do not contact each other which prevents short circuits.

Preferably, heights of the first and the second circular pad portions are identical to heights of the pads, the first and second circular pad portions protruding upward to a predetermined height due to surface tension, raising the height of the pad when the leads are secured to the pads, the leads depressed for a predetermined depth and then bonded so that the leads are secured to the pads even when the leads are not horizontal.

More preferably, the first and second circular pads are fused to both lateral sides of the leads, resisting force exerted in lateral directions when the leads are secured to the pads.

In order to achieve the above objects, a pad structure for a semiconductor package according to the present invention may comprise: a printed circuit board with solder lands formed on predetermined portions thereof; and a plurality of pads formed on upper surfaces of the solder lands, first pads with circular pad portions formed on predetermined locations thereof, second pads with circular pad portions disposed in alternating manner with respect to the circular pad portions of the first pads formed on predetermined locations thereof, the first pads and the second pads continuously repeated on the pads, wherein the leads are secured to the pads so that when the first and second circular pad portions are pushed laterally, the circular pad portions do not contact each other whereby short circuits are prevented.

Preferably, heights of the first and the second circular pad portions are identical to heights of the pads, the first and second circular pad portions protruding upward to a predetermined height due to surface tension raising the height of the pad when the leads are secured to the pads, the leads depressed for a predetermined depth and then bonded so that the leads are secured to the pads even when the leads are not horizontal.

More preferably, the first and second circular pads are fused to both lateral sides of the leads, resisting force exerted in lateral direction when the leads are secured to the pads.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
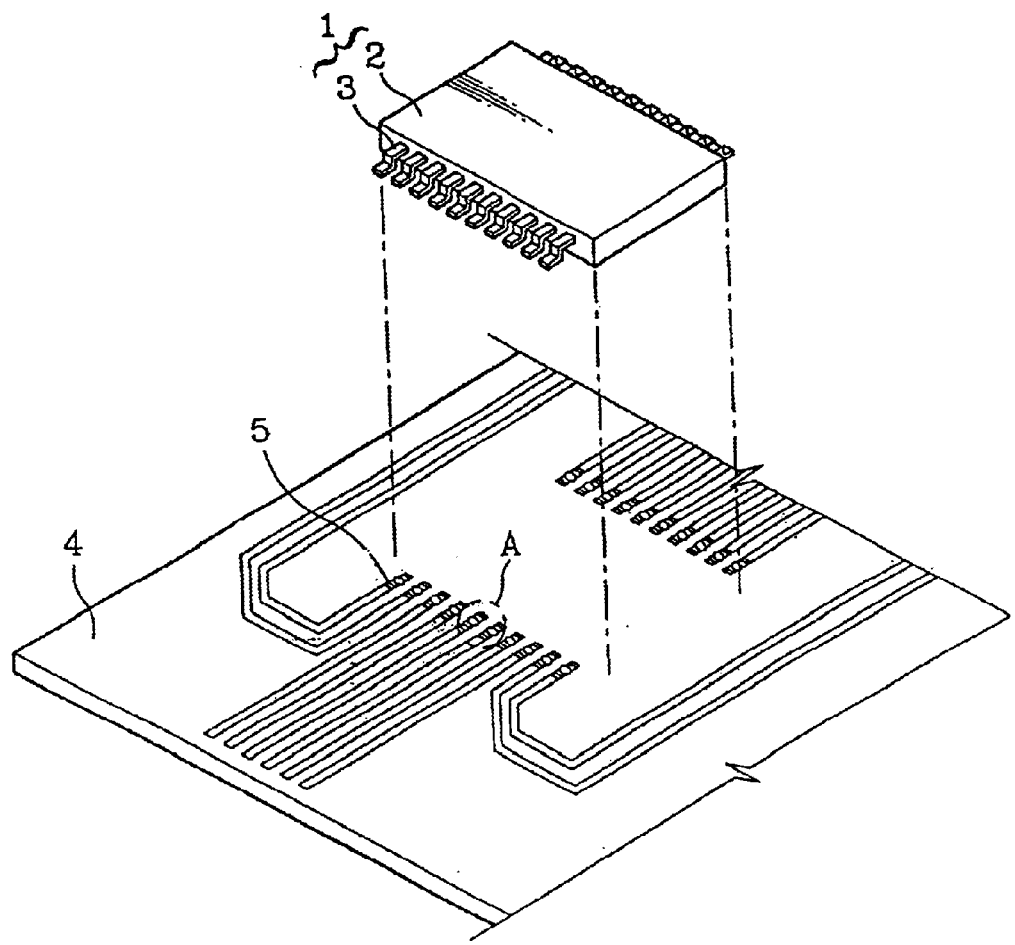
FIG. 1 is a perspective view showing a typical semiconductor package attached to the PCB.
Figure 2:
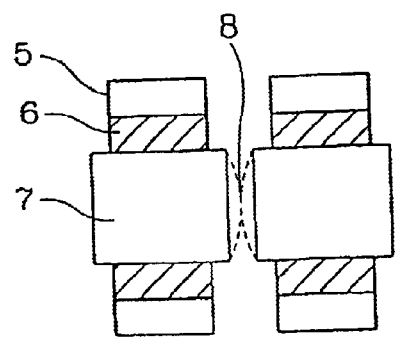
FIG. 2 is a plan view schematically showing portion "A" of FIG. 1.

Turning now to the drawings, FIG. 1 is an exploded perspective view of a semiconductor package secured to a PCB, and FIG. 2 is a plan view showing the "A" portion of FIG. 1, as discussed above.

As can be seen in the drawing, the semiconductor package 1 comprises a semiconductor body 2 and a plurality of leads 3 extending from both sides of the semiconductor body 2. On the PCB 4 at locations corresponding to the leads 3, a plurality of pads 5 are formed. At the middle portion of the pad 5, a squared pad portion 7 is formed. When securing the package 1 onto the PCB 4, the leads 3 are soldered to the engaging portions 6 and the squared pad portions 7.

However, when the lead 3 is attached to the pad 5, the squared portions 7 of the pad 5 protrude laterally, forming a contact portion 8 abutting with the squared portion of the adjacent pad. This prevents short circuits which deteriorate the performance of the semiconductor.

Figure 3:
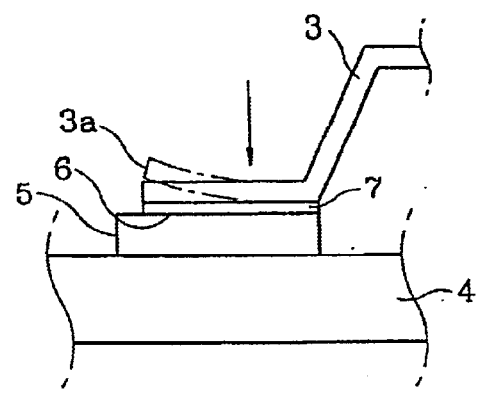
FIG. 3 is a sectional view showing a typical floating lead of the semiconductor package.

Generally, flatness of the pad 5 is maintained within 80 to 100 $\mu$m. The lead 3 is attached to the pad 5 uniformly when such flatness is maintained. However, as illustrated in FIG. 3, when the end portions 3a of the connectors and leads 3 of a quad flat pack (QFP) are raised upward for a predetermined height rendering the flatness to exceed 150 $\mu$m, the lead 3 may float or the leads 3 may not be attached to the pad 5 properly. This may also cause inadequate tensile strength.

Furthermore, since the squared pad portion 7 is formed at the middle portion of the pad 5, the lead tends to be fused only to both lateral sides of the middle portions of the lead 3. Therefore, when the lead is not maintained horizontal to a predetermined degree, the forward or rear portion tends to float with only the middle portion being attached, reducing the tensile strength.

The present invention will now be described in detail referring to the accompanying drawings. However, the embodiments hereinafter described should be interpreted as illustrative and in no sense limiting.

Figure 4:
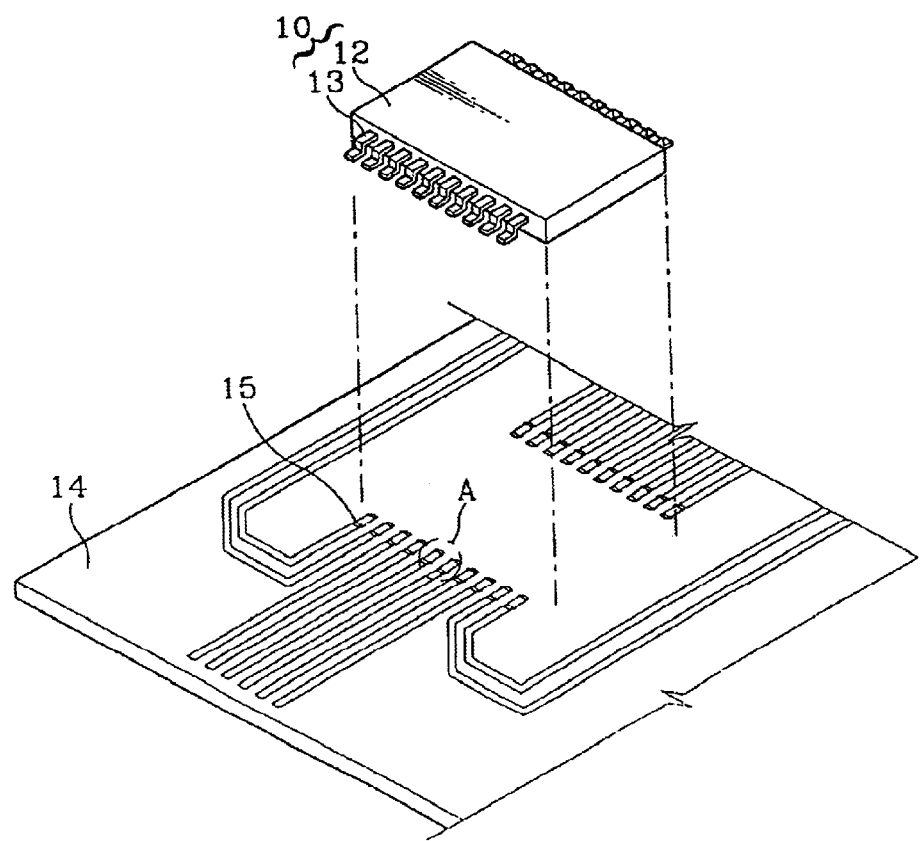
FIG. 4 is a perspective view showing a semiconductor package according to a preferred embodiment of the present invention attached to the PCB.

FIG. 4 is an exploded perspective view showing a semiconductor package according to the present invention attached to a PCB. As can be seen in the drawing, the semiconductor package 10 comprises a body 12 and a plurality of leads 13 extending from the body 12. A plurality of solder lands are formed on locations of the PCB 14 corresponding to the location of the leads 13. A plurality of pads 15 are formed on upper portions of the solder lands. Such pads are referred to as Projection Solder ("P.S.") pads which will be simply termed pads hereinafter.

Figure 5:
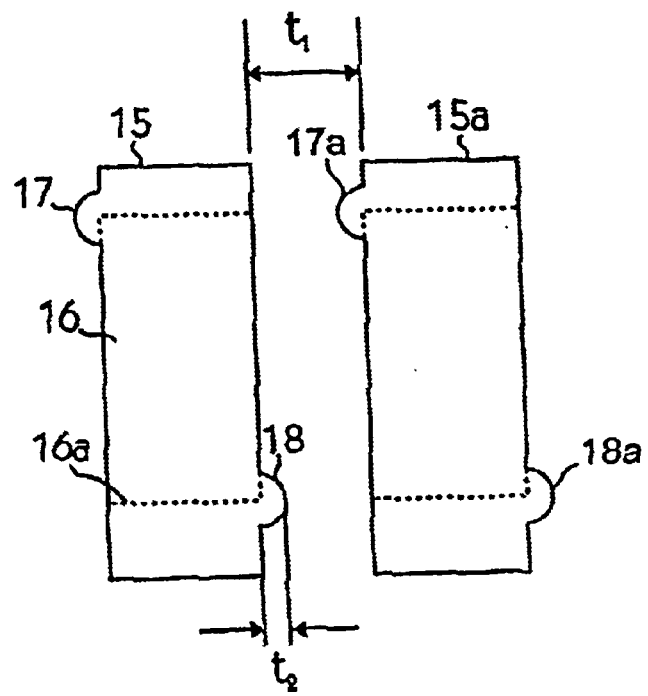
FIG. 5 is a plan view schematically showing portion "A" of FIG. 4.
Figure 6:
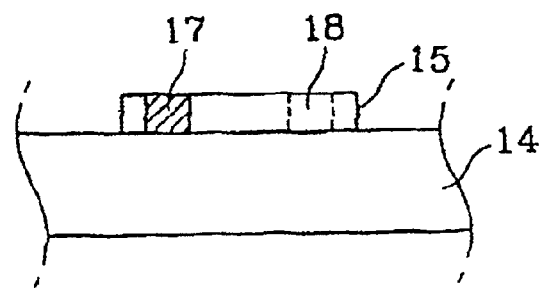
FIG. 6 is a lateral sectional view showing the lateral section of a preferred embodiment of a pad according to the present invention.

As can be seen in FIGS. 5 & 6, pads 15 and 15a are rectangular and formed on the PCB 14 with a predetermined thickness by a mask process. Circular pad portions 17 are each formed on predetermined locations of the pads (15, 15a). Bonding regions 16, to which leads are attached, are on the upper surface of the pads 15. Spacing t1 between the pads 15 and 15a is decided according to the spacing between the leads 13 (refer to FIG. 4) of the semiconductor package 10. In actual product, the spacing t1 ranges from approximately 0.4 mm to 0.65 mm.

At predetermined locations of the lateral sides of the pad 15, the first and second circular pad portions 17 & 18 are formed protruding in lateral direction in a zigzagged manner. In the embodiment shown, these take the form of semicircular protrusions from diagonally opposite sides of pad 15. The first and second circular pad portions 17 & 18 protrude for a predetermined length t2, preferably ranging from approximately 0.065 mm to 0.1 mm according to the spacing between the pads 15.

Short circuits are prevented since circular pad portions 17a and 18a of the pad 15a are prevented from contacting each other, or the circular pad portions 17 and 18 of pad 15, even when the first and second circular pad portions 17, 18 are pressed in the lateral direction by the lead 13 (refer to FIG. 4).

Furthermore, since heights of the first and second circular pad portions 17, 18 are the same as the height of the pad 15, the circular pad portions 17, 18 can abut the lower surface of the lead 13 in a uniform manner.

Figure 7:
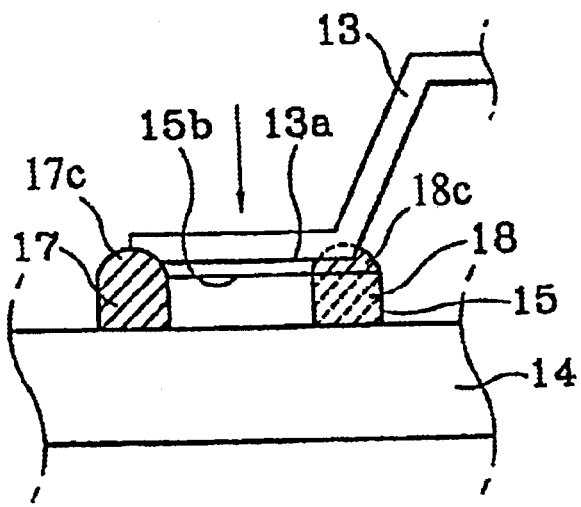
FIG. 7 is a side view showing an initial stage of attaching the lead of the semiconductor package onto an upper surface of the pad according to the present invention.
Figure 8:
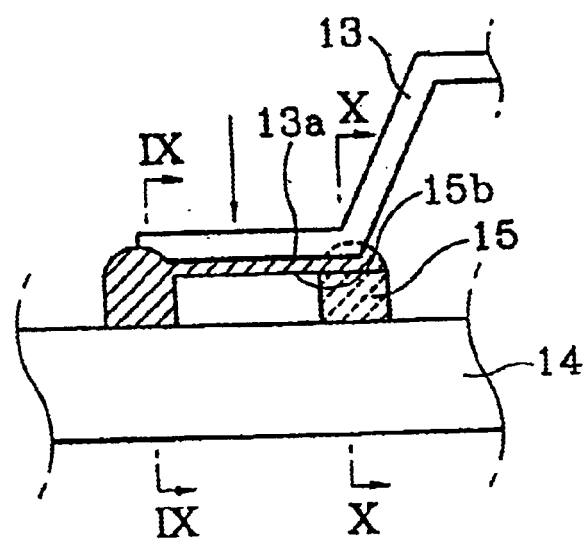
FIG. 8 is a side view showing the lead of the semiconductor package after attaching it to the upper surface of the pad.

FIG. 7 is a side view showing an initial stage of attaching the lead of the semiconductor package on an upper surface of the pad according to the present invention. and FIG. 8 is a side view showing the lead of the semiconductor package after attaching it to the upper surface of the pad. As can be seen in the drawings, heat is applied to the pad 15 when attaching the lead 13 to the pad 15. When the pad 15 is turned into liquid having certain viscosity, the lead 13 is moved downward, the lower surface 13a of the lead 13 approaching the upper surface 15b of the pad 15.

When the lower surface 13a of the lead 13 approaches the upper side 15b of the pad 15, upper portions of the first and second circular pad portions 17 & 18 rise upward as the solder melts. Since the first and second circular pad portions 17 & 18 are circular, solder is concentrated in the center part of the of the first and second circular pad portions 17 & 18 due to surface tension. That is, the solder wells up forming meniscuses 17c and 18c. Therefore, as the lead 13 gradually descends, solder of the first and second circular pad portions 17 and 18, along with the solder between pad portions 17 and 18, concentrates in the direction of the first and second pad portions 17 & 18, resulting in a sufficient rise of the pad 15 to depress (sink) the lead 13 within the solder of the first and second pad portions.

Therefore, as can be seen in FIG. 8, when the lead 13 is continuously moved downward and settles on the upper surface 15b of the pad 15, the lower surface 13a of the lead 13 is depressed, that is, partially submerged, within the upper surface 15b of the pad 15. Therefore, the lead 13 can be firmly attached even when it is not perfectly horizontal.

Furthermore, the first and second pad portions 17 & 18 are pushed to both sides and fused to both side surfaces 15c (FIG. 10) and 15d (FIG. 9) of the lead 13. Therefore, the lead 13 abuts the pad 15 in a uniform manner and increases tensile strength thereof since both sides are supported.

On the other hand, after attaching the semiconductor package 10 to the PCB 14 according to the aforementioned procedure, the PCB 14 goes through a heating device such as a heater. During such process, the pad 15 melts and adhesion of the solder between the leads 13 and the pads 15 becomes uniform.

Figure 9:
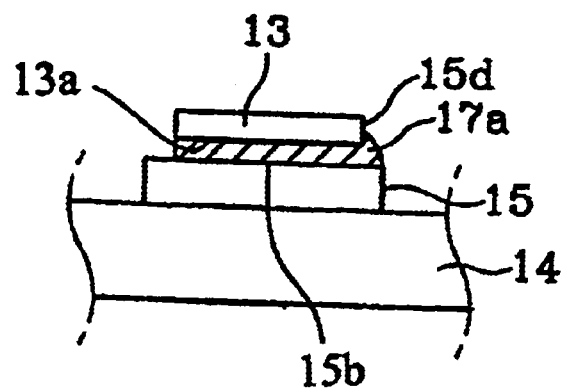
FIG. 9 is a sectional view cut along line IX—IX of FIG. 8.
Figure 10:
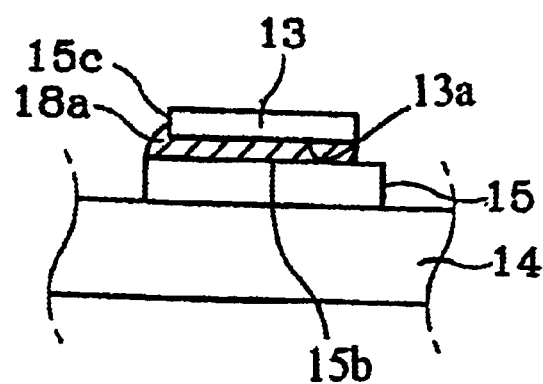
FIG. 10 is a sectional view cut along line X—X of FIG. 8.

FIG. 9 is a sectional view cut along line IX—IX of FIG. 8, and FIG. 10 is a sectional view cut along line X—X of FIG. 8.

As can be seen in the drawings, once the leads 13 are settled on the pads 15, the upper surfaces 15b of the pads 15 uniformly contact the lower surfaces 13a of the leads 13. Also, the first circular pad portion 17 (refer to FIG. 5) is pushed laterally by the force exerted by the lead 13 and is bonded to a first side surface 15d of the lead 13, forming a first fused portion 17a (see FIG. 9). Therefore, a lateral load of the lead 13 is resisted.

Furthermore, the second circular pad portion 18 is also pushed laterally by the force exerted by the lead 18 and a second fused portion 18a is formed by bonding it to a second side surface 15c (see FIG. 10). Therefore, loads applied to the lead 13 in both lateral directions are supported by the first and second circular pad portions 17 & 18. Thus, the tensile strength of the lead and the pad is enhanced.

Figure 11:
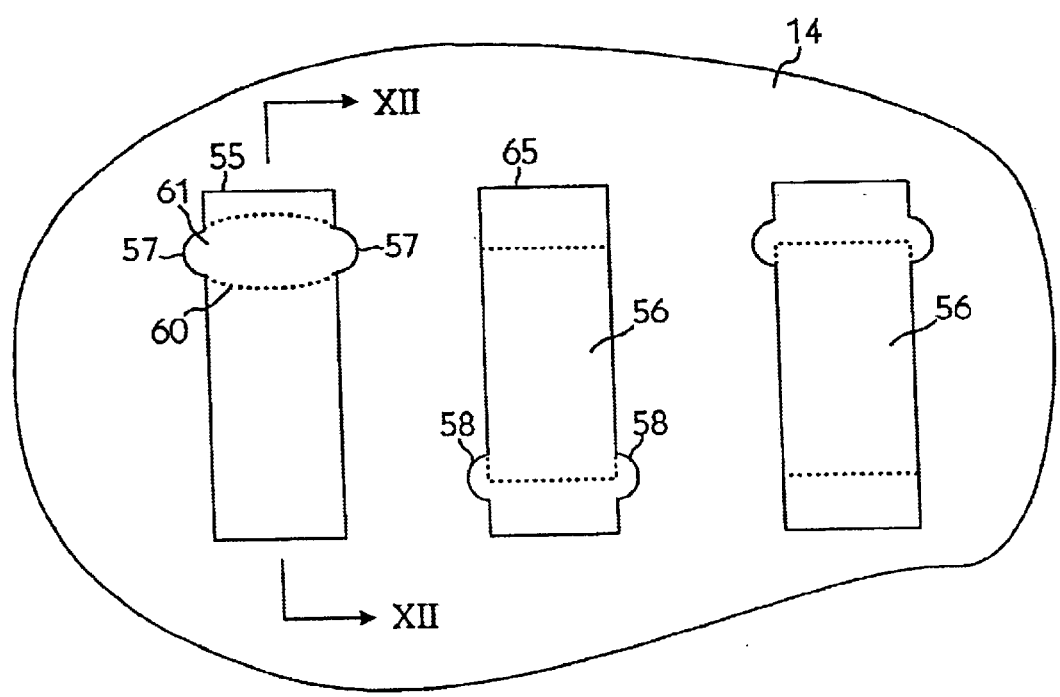
FIG. 11 is a plan view showing pads according to another embodiment of the present invention.

Another preferred embodiment according to the present invention is shown in FIG. 11. The difference in this preferred embodiment lies in the shape of the circular pad portion. That is, on predetermined location of the pads 55 and 65 are formed circular pad portions 57 and 58. Two circular pad portions are formed laterally opposite each other on each pad. Thus, the circular pad portions 57 of pad 55 define a rounded region 61 as bounded by dotted line 60 in FIG. 11. Regions 56 indicates the regions of the pads where the leads will be attached.

The circular pad portions 57 and 58 of the pads 55 and 65 are disposed in a zigzagged manner. That is, they are disposed alternately toward opposite ends of adjacent pads, in zig-zag fashion along a line of pads. This arrangement can also be considered to be an alternating antiparallel arrangement of pads having the shape of pad 55.

Since the first and the second circular pad portions 57, 58 are disposed in a zigzagged manner, they do not contact each other even when the lead 53 is pressed in lateral direction, preventing short circuits.

Figure 12:
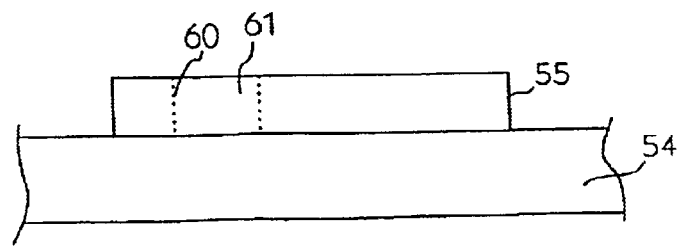
FIG. 12 is a sectional view taken along line XII—XII of FIG. 11.

As can be seen in FIG. 12, height of circular pad portions 57, and region 61, are maintained identical to that of pad 55 so that the pad can maintain uniform contact with the lower surface 53a (refer to FIG. 14) of the lead 53.

Figure 13:
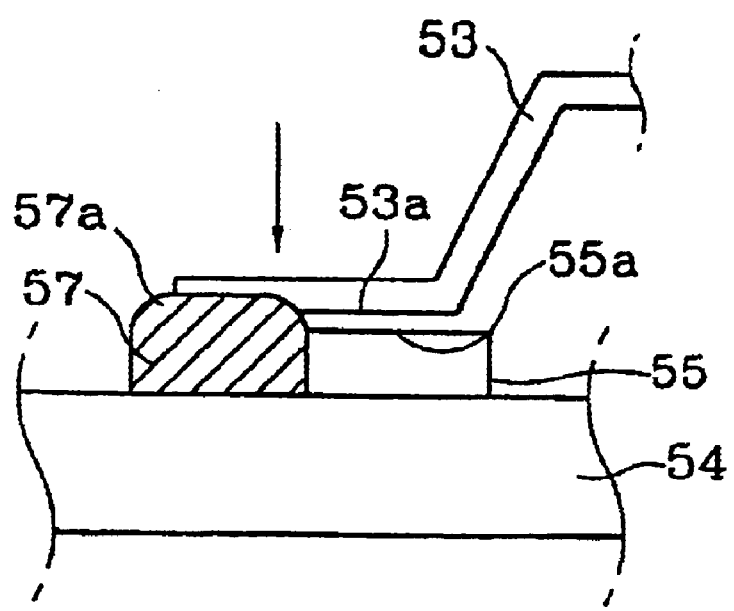
FIG. 13 is a side view showing a lead of a semiconductor package before securing it to the pad.
Figure 14:
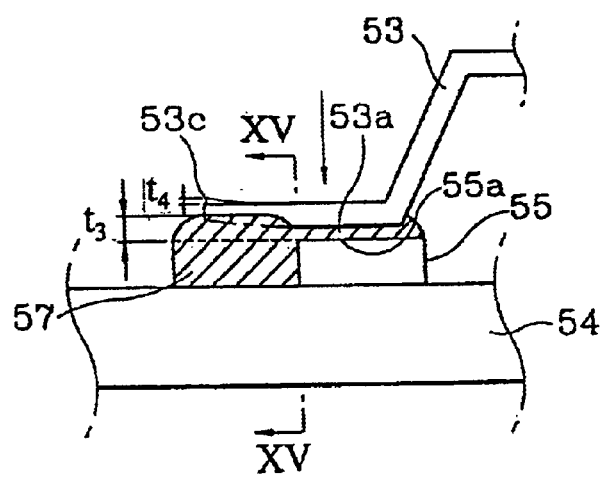
FIG. 14 is a side view showing the lead of the semiconductor package after securing it to the pad.

As can be seen in FIGS. 13 and 14, heat is applied to the pad 55 when attaching lead 53 to the pad 55. During the heating, the pad 55 turns into a liquid having a certain viscosity and, by moving the lead 53 downward, the lower surface 53a of the lead 53 approaches the upper surface 55a of the pad 55.

When the lower surface 53a of the lead 53 approaches the upper surface 55a, attracting force tends to raise the pad 55 upward. During such an action, solder concentrates at a center portion of the region 61 between circular pad portions 57 due to surface tension. Therefore, the upper end portions of the pad 55 and the circular pad portions 57 rise upward to a predetermined length t1, contacting the lower surface 53a of the lead 53.

Figure 15:
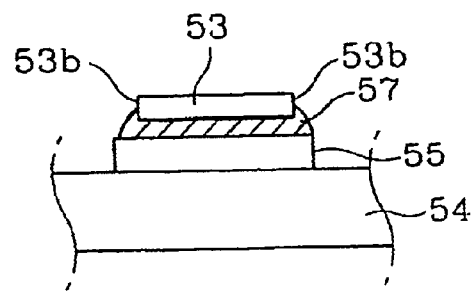
FIG. 15 is a sectional view taken along line XV—XV of FIG. 14.

As can be seen in FIGS. 14 and 15, when the lead 53 constantly moves downward and settles on the upper surface 55a of the pad 55, the lower surface 53a of the lead 53 makes uniform contact with the upper surface of the pad 55 and is depressed therein to a predetermined depth. The circular pad portions 57 are pushed to both sides of the lead 53. The circular pad portions 57 pushed to the sides are fused to both sides 53b of the lead 53, resisting the force exerted on the lead in a lateral direction.

The circular pad portions 57 and 58 of the pads 55 and 65 are disposed in a zigzagged manner so that both sides 53b of the lead are fused, thereby supporting the lead 53 in zig-zagged shape. That is, the circular pad portions 57 and 58 are formed on the sides of the pads 55 and 65 toward opposite ends of the pads 55 and 65 on alternate pads. This yields a zigzag pattern along a row of pads 55 and 65. Therefore, the lead 53 resists the load applied in a lateral direction.

Furthermore, even when the lead 53 is not horizontal and the end portion 53a of the lead 53 is raised, the lead 53 is depressed within the pad 55 to a predetermined depth so that floating or non-contacting of the pad 55 does not occur when the raised height t4 of the lead 53 is within the raised height t3 of the circular pad portion 57. Since the lead 53 makes uniform contact with the pad 55, tensile strength is enhanced.

After attaching the semiconductor package 50 onto the PCB 54, the PCB 54 goes through heating equipment such as a heater, during which the pad 55 melts to make the soldering between the pad 55 and the lead 53 uniform.

Figure 16:
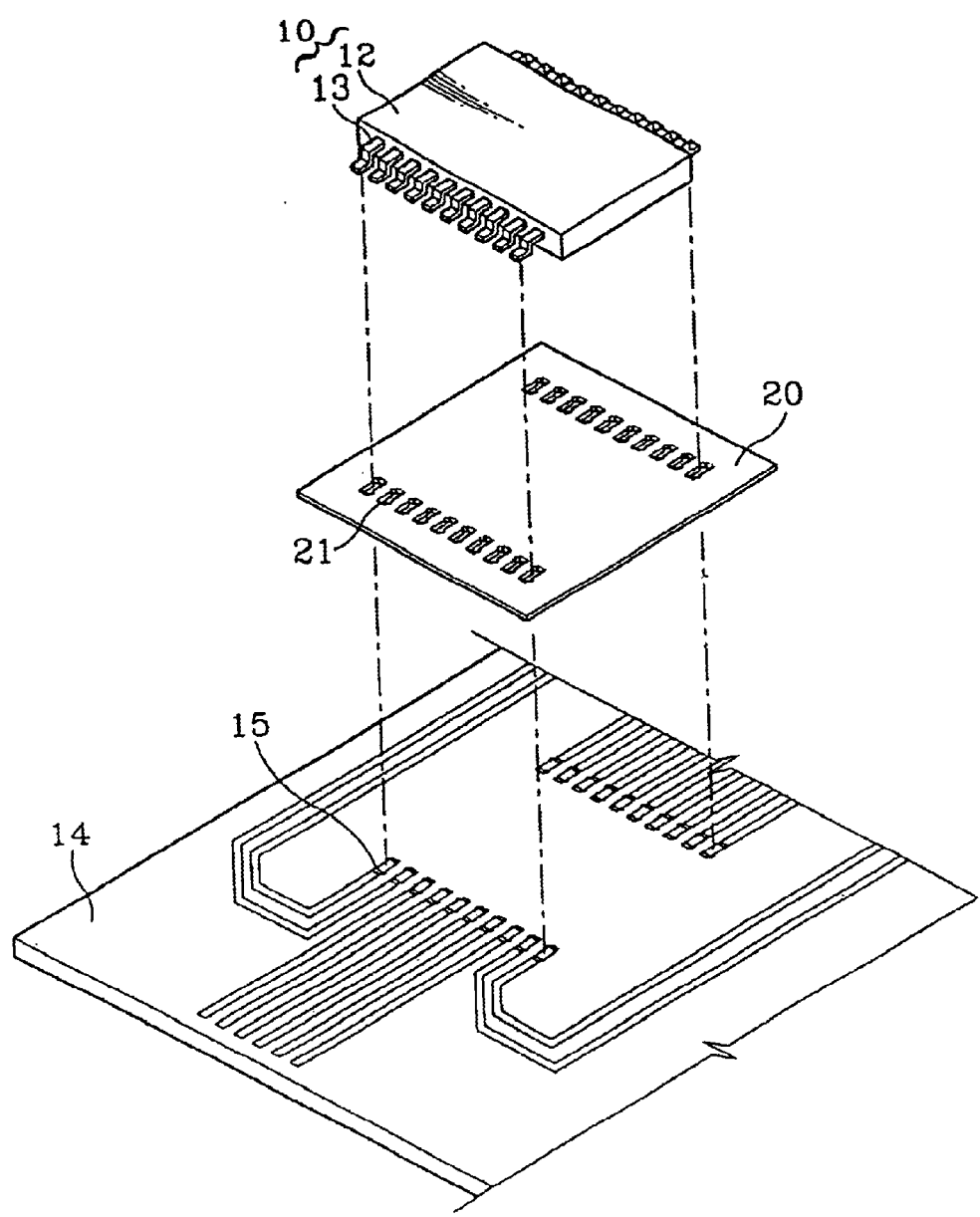
FIG. 16 shows the process of forming a pad according to the present invention.

Hereinafter, steps for attaching the semiconductor according to a preferred embodiment of the present invention will be discussed in more detail. Referring to FIG. 16, solder lands are formed on the PCB 14 using such methods as etching. Then, pads 15 are formed on upper surfaces of the solder lands using a metal mask 20. That is, a plurality of opened portions 21 are perforated on the metal mask 20 at locations corresponding to the locations of the pads 15. Therefore, a plurality of opened portions 21 having a shape identical to that of the pads 15 are formed on the metal mask 20.

After placing the metal mask 20 on the PCB 14, solder cream is deposited on the metal mask 20. Then the metal mask 20 is removed. Since solder cream remains on the opening portions 21, a plurality of pads 15 are formed.

As can be seen in FIGS. 4 to 10, the pad 15 is heated and turned into a liquid having a certain viscosity. Then the lead 13 of the semiconductor package 10 is settled on the upper surface of the pad 15. Here, the first and second circular pad portions 17 & 18 protrude upward for a predetermined length due to surface tension, contacting the lower surface 13a of the lead 13.

In this state, the lead 13 is pressed downward so that the lower surface 13a of the lead 13 is distributed uniformly on the upper surface 15b of the pad 15. The first and second circular pad portions 17, 18 are pushed in a lateral direction and fused to the first and second side surfaces 17a, 18a of the lead 13. Here, since the first and second pad portions 17, 18 are shaped in a zigzagged manner, both sides of the lead 13 are supported in a zigzagged manner. Therefore, the lead 13 resists load in a lateral direction.

Since the PCB 14 is heat treated by passing the heater, fusing between the pad 15 and the lead 13 becomes more uniform. This means that the lead 13 and the pad 15 are secured in a uniform manner, resisting stronger vertical and lateral loads.

As stated above, the pad 15 is disposed in a zigzag manner, preventing contact between adjacent pads, which causes short circuits.

Furthermore, since a plurality of circular pad portions 17, 18 support both lateral sides 17a, 18a and the lower surface 13a of the leads 13 in a zigzag manner, the deviation of the leads 13 from horizontal form or misplacement of a mounter can be compensated, which raises the tensile strength between the pads 15 and the leads 13.

What is claimed is:

1. A method of attaching leads of a semiconductor package to a printed circuit board, comprising the steps of:
   forming pads on solder lands of the printed circuit board in accordance with an arrangement of the leads of the semiconductor package, each pad having a generally rectangular shape;
   forming two protruding circular pad portions on respective opposite long sides of each said pad;
   heating the pads while lowering the leads of the semiconductor package onto the pads; and
   contacting a bottom surface of each said lead of the semiconductor package with solder welling up over the protruding circular pad portions until the solder flows so as to partially submerge the lead in the pad.

2. The method of claim 1, further comprising the step of:
   initially forming the pads on the solder lands by placing a metal mask, having the shapes of the pads, over the printed circuit board, and applying solder cream to the mask.

3. The method of claim 2, further comprising the step of:
   after said contacting step, heat treating the printed circuit board using a heater.

4. The method of claim 3, further comprising the step of:
   orienting said two protruding circular pad portions diagonally opposite to each other.

5. The method of claim 3, further comprising the steps of:
   orienting said two protruding circular pad portions laterally opposite to each other; and
   orienting each said pad antiparallel to said pad adjacent to it.

6. The method of claim 1, further comprising the step of:
   providing said semiconductor package as a quad flat pack.

7. The method of claim 2, further comprising the step of:
   orienting said two protruding circular pad portions diagonally opposite to each other.

8. The method of claim 2, further comprising the steps of:
   orienting said two protruding circular pad portions laterally opposite to each other; and
   orienting each said pad antiparallel to said pad adjacent to it.

9. The method of claim 1, further comprising the step of:
   after said contacting step, heat treating the printed circuit board using a heater.

10. The method of claim 9, further comprising the step of:
    orienting said two protruding circular pad portions diagonally opposite to each other.

11. The method of claim 9, further comprising the steps of:
    orienting said two protruding circular pad portions laterally opposite to each other; and
    orienting each said pad antiparallel to said pad adjacent to it.

12. The method of claim 1, further comprising the step of:
    orienting said two protruding circular pad portions diagonally opposite to each other.

13. The method of claim 1, further comprising the steps of:
    orienting said two protruding circular pad portions laterally opposite to each other; and
    orienting each said pad antiparallel to said pad adjacent to it.

* * * * *